United States Patent [19]
Uchida et al.

[11] Patent Number: 5,583,881
[45] Date of Patent: Dec. 10, 1996

[54] SEMICONDUCTOR LASER AND METHOD FOR MANUFACTURING THE SAME

[75] Inventors: Satoshi Uchida; Hiroshi Mataki, both of Kyoto, Japan

[73] Assignee: Rohm Co., Ltd., Kyoto, Japan

[21] Appl. No.: 383,859

[22] Filed: Feb. 6, 1995

[30] Foreign Application Priority Data

Oct. 2, 1994 [JP] Japan ................................. 6-016843

[51] Int. Cl.$^6$ ........................................ H01S 3/19
[52] U.S. Cl. .................. 372/49; 372/45; 372/46
[58] Field of Search ................... 372/45, 46, 49, 372/32

[56] References Cited

U.S. PATENT DOCUMENTS

| | | | |
|---|---|---|---|
| 5,235,609 | 8/1993 | Uchida et al. | 372/46 |
| 5,297,158 | 3/1994 | Naitou et al. | 372/46 |
| 5,369,658 | 11/1994 | Ikawa et al. | 372/45 |

FOREIGN PATENT DOCUMENTS

| | | |
|---|---|---|
| 4-144184 | 5/1992 | Japan . |
| 5-160503 | 6/1993 | Japan . |
| 6-13705 | 1/1994 | Japan . |

OTHER PUBLICATIONS

8106 IEEE Journal of Quantum Electronics 29(1993) Jun., No. 6, New York, US "600 mW CW Single–Mode GaAlAs Triple–Quantum–Well laser with a New Index Guided Structure".

Primary Examiner—James W. Davie
Attorney, Agent, or Firm—Nikaido Marmelstein Murray & Oram LLP

[57] ABSTRACT

A semiconductor laser includes an active layer having a light-emitting region of striped structure. A cladding layer is formed on the active layer. Another cladding layer is formed under the active layer. The active layer is interposed between the cladding layer and the another cladding layer. Facets are formed on both ends of a stripe of the light-emitting region in which a part of light emitted radiated, and the remaining light is reflected and amplified. The semiconductor laser includes a means for having a minimum value of a coherence in a range between 2 mW and 7 mW of output of a light radiated from one of the facets which is a light output, and for preventing a phenomenon in which the output is reduced in a range at most 25 mW in accordance with an increase of the current, varied by a variation of a current applied to the active layer.

11 Claims, 15 Drawing Sheets

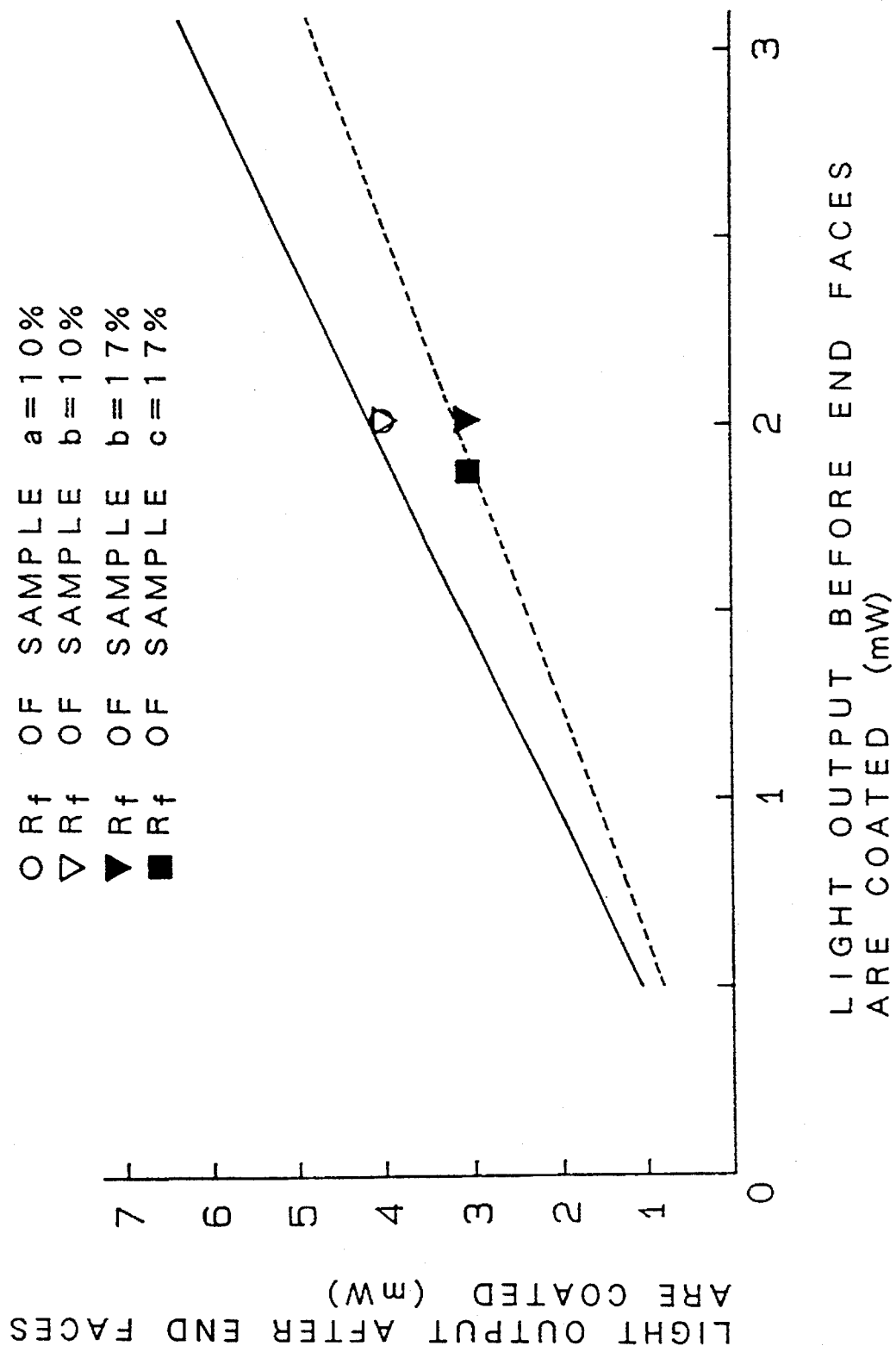

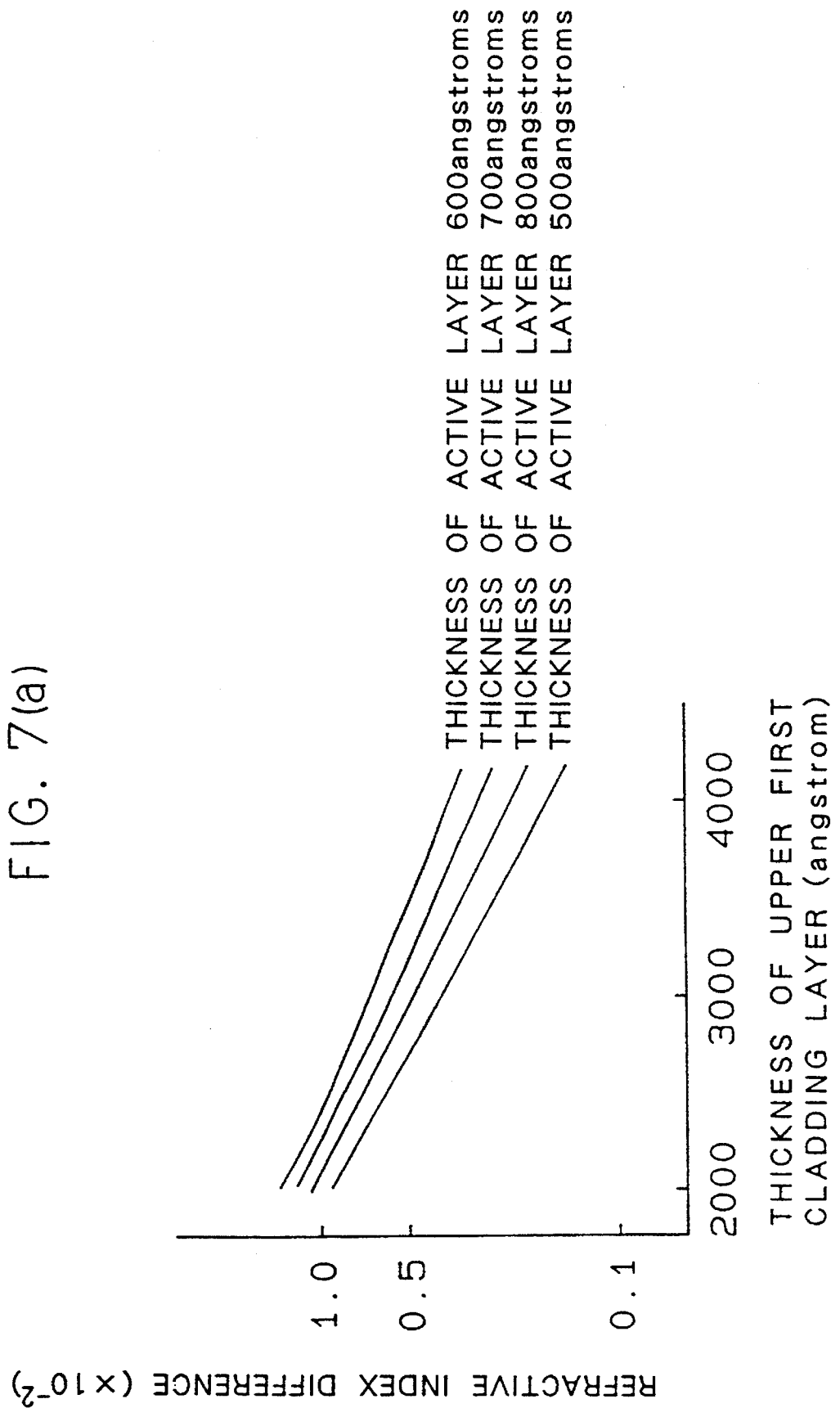

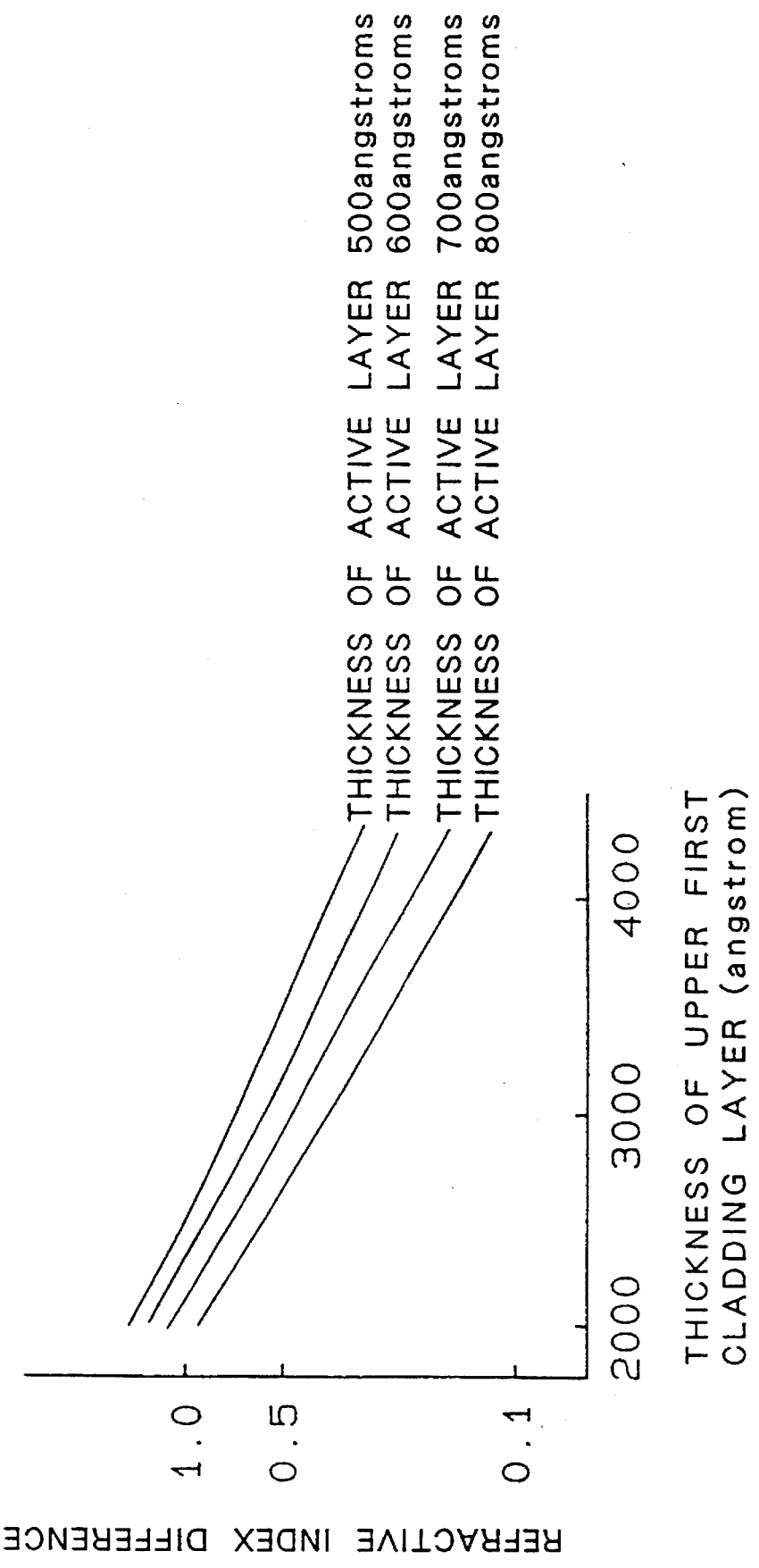

SEMICONDUCTOR LASER AND METHOD FOR MANUFACTURING THE SAME

FIELD OF THE INVENTION

The present invention relates to a semiconductor laser with low induced noise caused by feedback light and a method for manufacturing the semiconductor laser. More particularly, the invention relates to the semiconductor laser, in particular, a high power semiconductor laser, used for pick-up light sources of recordable optical disks such as mini disks, optical magnetic disks, and a method for manufacturing the semiconductor laser.

BACKGROUND OF THE INVENTION

Recently, a need for a semiconductor laser, which can provide not only low-noise characteristics at light output power of 3 mW to 5 mW but also a high output power of 20 mW or larger (in general, 30 mW to 40 mW), has increased as light sources for reading and writing in mini disks and optical magnetic disks.

Initial characteristics which are required for this type of semiconductor laser include (1) single transverse mode oscillation up to high output power operation, (2) low astigmatism, (3) low ellipticity, and (4) low noise.

Of these characteristics, in order to satisfy (1) the single transverse mode oscillation up to high output power operation (that is, a phenomenon in which light output power is not monotonously increased in accordance with an increase of a current up to a desired high output power operation but the output power lowers at a certain current (hereinafter referred to as "kink") is not generated) and (2) low astigmatism, techniques to provide low-reflectance coating to the facet of an outgoing beam side as well as to employ an index waveguide structure as a semiconductor laser chip structure are adopted. This is because in the index waveguide structure, a single transverse mode and reduced astigmatism are easy to obtain. In addition, if the outgoing beam side facet is designed to be a low reflectance, a beam output efficiency is increased and in addition to further increase the current level that generates the kink, reliability can be improved. In order to achieve low ellipticity, each current injection width of chips is narrowed to increase the beam divergence angle parallel to the active layer or the active layer is made with thin films so that the beam divergence angle vertical to the active layer is made smaller. All these techniques intend to further increase an index difference in the lateral direction (parallel to the active layer) and do not interfere the above-mentioned required characteristics (1), (2) (for example, see pages 50 to 60 or pages 108 to 110, "Semiconductor Laser" by Ryoichi Ito et al, Baifukan 1989).

However, a laser having an index waveguide structure generally causes single longitudinal mode oscillation even in the low output power operation (for example, in the vicinity of beam output power 3 mW) when information is read from disks such as photo magnetic disks and results in high coherence. The semiconductor laser with high coherence as described above is assumed to be easy to generate induced noise caused by feedback light, and is unable to satisfy low noise (4) described above. That is, the laser beam reflected and returned from the disk plate impinging in the semiconductor laser again causes the laser oscillation to be unstable.

To cope with this, conventionally, a method has been employed, in which high-frequency current of several hundreds of mega hertz (MHz) is superimposed over the laser driving current to multiplex the longitudinal mode so that coherence is lowered, thereby reducing optical feedback noise (Ryoichi Ito et al, "Semiconductor Laser," Baifukan, 1989, pages 314 to 315, as described above). However, this method required a high-frequency superimposing circuit in addition to a regular semiconductor laser driving circuit, creating problems of increased package size, high consumption current, and high costs. In addition, because high-frequency electromagnetic noise is generated, it causes serious problems in handling electronic equipment such as computers.

On the other hand, as methods to lower coherence without using the high-frequency superimposing technique, there are methods to (a) use a gain waveguide structure and (b) generate self-oscillation. However, but method (a) has a problem which results in increased astigmatism in addition to tendency to cause an unstable transverse mode. In the case of method (b), it is difficult to stably obtain the single transverse mode up to a high output power operation and it is easy to cause the kink, and it is also practically impossible to obtain light output power exceeding 20 mW.

That is, the conventional semiconductor laser which can provide high output power for writing has a problem of large noise at low output power for reading and the conventional semiconductor laser which can provide low noise characteristics at low output power for reading is unable to provide high output power for writing.

SUMMARY OF THE INVENTION

Accordingly, it is an object of the present invention to provide a semiconductor laser in which optical feedback noise is significantly suppressed at low output power operation (in the vicinity of 2 mW to 7 mW) and at the same time, high output power is achieved.

It is another object of the present invention to provide a method for fabricating a semiconductor laser which generates the minimum noise, in particular, in the reading output power of the models in which the said semiconductor laser is incorporated.

SUMMARY OF THE INVENTION

As the light source which can be used both for reading and writing of mini disks and optical magnetic disks, the light source providing output power as high as 20 mW or over for writing and about 2 mW to 7 mW output power with low noise for reading, a semiconductor laser has been found, the semiconductor laser having an index waveguide structure which can provide high coherence and high output power, which can reduce the lateral index difference (that is, bringing it to the gain wave guide structure) generates the portion with reduced coherence (minimum coherence) in the range from 1 mW to 3 mW with a high output power operation maintained, which can reduce the optical feedback noise in its vicinity. Moreover, the light output power of the semiconductor laser, which generates the minimum coherence, can be freely varied in the range from 2 mW to 7 mW by varying the reflectance of the facet which is a beam radiating surface of the semiconductor laser. As a result, the semiconductor laser bare chip (that is without facet coating) which provides the minimum coherence at a low output of 1 mW to 3 mW has been fabricated and the reflectivities of both facets of the chip has been adjusted to bring the minimum coherence to the vicinity of the desired reading output power. Finally, the semiconductor laser which can reduce coherence at the reading output power, that is, reduce the optical feedback noise and radiates high output power for writing has been able to be obtained.

The semiconductor laser of the present invention is a semiconductor laser comprising an active layer having a light-emitting region of striped structure, a cladding layer formed on the active layer, another cladding layer formed under the active layer, the active layer being interposed between the cladding layer and the another cladding layer, facets formed on both ends of a stripe of the light-emitting region in which a part of light emitted is radiated, remaining light is reflected and the remaining light is amplified, wherein the semiconductor laser includes a means for having a minimum value of a coherence in a range between 2 mW and 7 mW of output power of a light radiated from one of the facets which is a light output, and for preventing a phenomenon in which the output power is reduced in a range at most 25 mW in accordance with an increase of the current, varied by a variation of a current applied to the active layer.

The means can be achieved by providing a current blocking layer on an upper first cladding layer formed on the active layer, the current blocking layer having a striped groove, each of the active layer, upper first cladding layer and current blocking layer is formed in a manner that a difference of a refractive index of lateral (or transverse) direction (hereinafter referred to as a lateral index difference) which is calculated from each of a refractive index and a thickness of the active layer, upper first cladding layer and current blocking layer is ranged from $4.2 \times 10^{-3}$ to $5 \times 10^{-3}$.

The difference of a refractive index of lateral direction means the difference between a reflectance of a part (light emitting region) corresponding to a striped groove of the current blocking layer provided on or beneath the active layer and another part outside the part.

The method for fabricating a semiconductor laser comprises steps of: (a) manufacturing a semiconductor bare chip having at least cladding layers in a manner that an active layer is interposed between the cladding layers, having a light-emitting region with a striped construction and having a minimum value of a coherence with a light output ranged from 1 mW to 3 mW without a dielectric film on a light emitting facet; and (b) adjusting a reflectance in an facet of a monitor side such that the reflectance is more than 50%, and another reflectance in another facet from which light is emitted such that the another reflectance is at most 30% and the minimum value of the coherence is varied in a manner that the light output is ranged between 2 mW and 7 mW by providing dielectric films on both the facet and the another facet of the semiconductor bare chip.

According to the present invention, the semiconductor laser is constructed in such a manner that coherence is reduced at the low output power of 2 mW to 7 mW. Therefore, coherence is small at low output power for reading, generation of optical feedback noise is significantly suppressed, and recorded information can be accurately read at low noise.

On the other hand, the semiconductor laser is constructed in such a manner as to prevent generation of a at the output power of at least 25 mW or lower when current is increased and light output increases. Therefore, high output exceeding 20 mW required for writing is definitely obtained and accurate writing can reliably take place.

That is, according to the invention, because in the refractive index waveguide structure which is difficult to generate a and easy to obtain high output power operation, the lateral refractive index difference is designed to be reduced to bring the structure closer to the gain waveguide structure, at high output power operation, the semiconductor laser maintains the properties of the refractive index waveguide structure, preventing generation of a and providing high output power operation. On the other hand, at low output power, the properties of gain waveguide structure appears, in which coherence is reduced and generation of optical feedback noise can be significantly suppressed.

According to the method for manufacturing of semiconductor lasers of the present invention, a bare chip which generates the minimum coherence at low output power in the range from 1 mW to 3 mW to prevent generation of a at the output lower than 25 mW and adjustment is made to enable the minimum coherence to move to a desired output in the range from 2 mW to 7 mW by adjusting the reflectance of the light emitting surface. Therefore, the coherence can be readily made minimum at the light output power corresponding to the relevant models even if the light output power for reading differs in accordance with the models in which the semiconductor laser is incorporated, particularly enabling reduction of noise at the output power required at the time of reading.

BRIEF EXPLANATION OF THE DRAWINGS

FIG. 6 is a schematic illustration showing the relationship between the output power before coating a dielectric film on the beam outgoing side facet and that after coating;

FIGS. 7(a) to 7(b) are each views showing the relationship between the film thickness of the lower cladding layer with the active layer film thickness used as a parameter and the refractive index difference by computed value;

FIG. 8(a) shows the relationship between the driving current and the light output power, and FIG. 8(b) the relationship between the light emitting angle and relative intensity;

DETAILED DESCRIPTION

Figure 1:
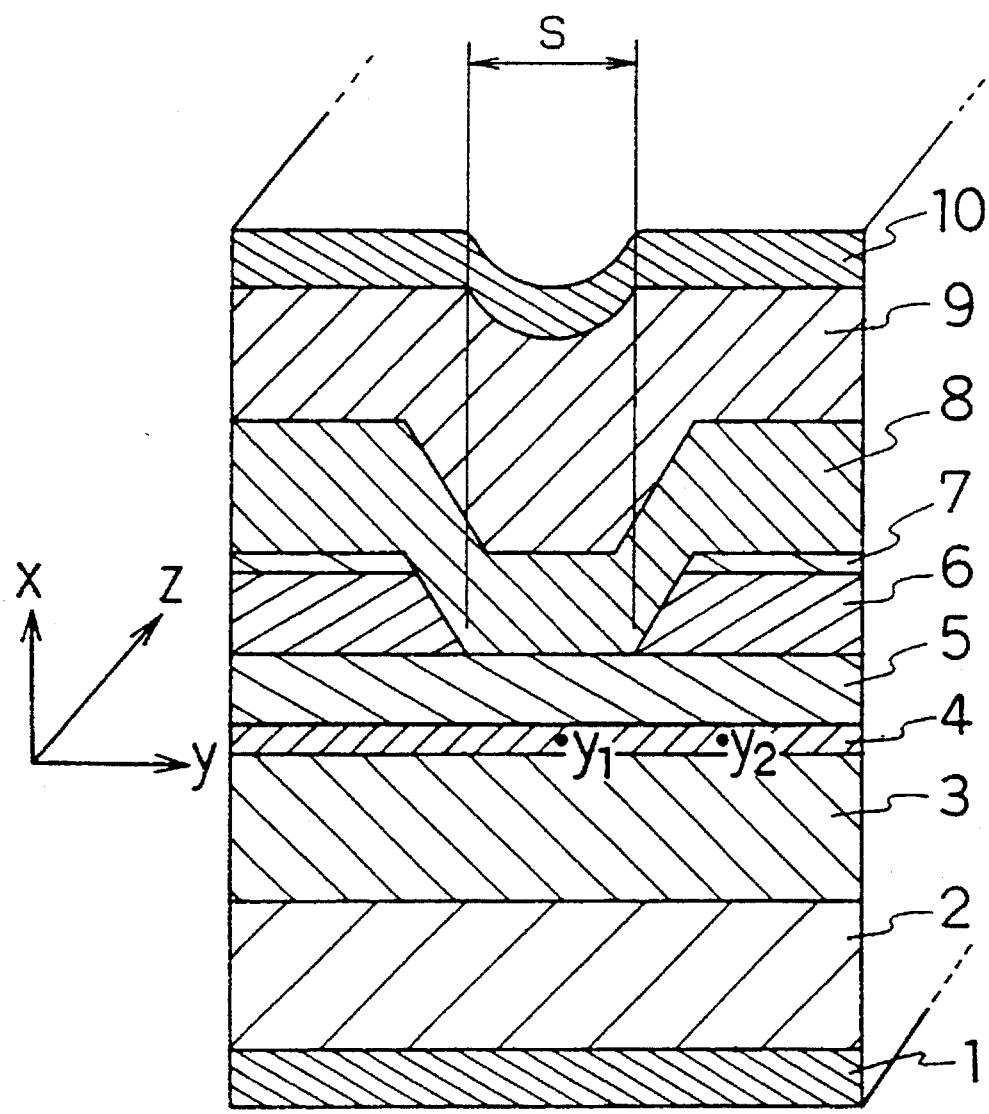
FIG. 1 is a cross sectional view of one embodiment of the semiconductor laser of this invention.

Now, embodiments of the present invention will be described in detail hereinafter. FIG. 1 is a diagrammatic illustration of a cross section of the chip structure of one embodiment of the semiconductor laser of this invention.

In FIG. 1, numeral 1 is an n-side electrode, 2 and n type GaAs substrate, 3 a lower cladding layer (for example, 20000 Å) comprising n-type $Al_xGa_{1-x}As$ ($0.45 \leq x \leq 0.75$, for example x=0.6), 4 an active layer (for example, 500 Å) comprising an n, p or non-dope type $Al_yGa_{1-y}As$ ($0 \leq y \leq 0.22$, for example, y=0.15), 5 the first upper cladding layer (for example, 3700 Å) comprising p type $Al_xGa_{1-x}As$, 6 a current blocking layer (for example, 2800 Å) comprising an n type GaAs, 7 an evaporation preventing layer (for example, 700 Å) comprising $Al_zGa_{1-z}As$ ($0.05 \leq z \leq 0.22$, for example z=0.15), 8 the second upper cladding layer (for example, 16000 Å) comprising p type $Al_xGa_{1-x}As$, 9 a cap layer (for example, 20000 Å) comprising a p type GaAs, and 10 a p-side electrode. The stripe width S is, for example, 3.9 µm.

For the n type dopant, Si is used, and for the p type dopant, Be is used, however for the n type, Sn may also be used and for the p type, Zn may also be used. Under the above-mentioned structure, an n type substrate is used but a p type substrate may also be used, in which case the n type and p type in the above-mentioned description should be all reversed.

This structure is a complex refractive index waveguide structure which encloses light in the stripe due to a light absorption loss by the GaAs current blocking layer, but in order to achieve stable single lateral mode under this structure, the film thickness of the first upper cladding layer comprising the p type $Al_xGa_{1-x}As$ is generally controlled to around 3000 Å.

As described above, the inventors of the present invention have earnestly investigated to obtain a semiconductor laser which generates low noise at the low output power for reading photo-electro-magnetic disks to enable correct and accurate reading and at the same time provides the high output power required for writing during writing, and have acquired the following knowledge. That is, for example, making the film thickness of the above-mentioned first upper cladding layer 3000 Å to 3700 Å as usual reduces the lateral refractive index difference and the minimum coherence at the output power being as low as 1 mW to 3 mW under the bare (noncoating) chip condition in which no dielectric film is provided on both of the facets, and adjusting the reflectance of the facets can adjust the light output at which the minimum coherence occurs, and fabricating the semiconductor laser chip in such a manner that the output power that minimizes coherence under the bare chip condition becomes 1 mW to 3 mW can provide high output free from generation of a kink at the output power at least 25 mW or lower.

That is, the semiconductor laser of the present invention has an active layer with a light emitting area of a stripe structure, cladding layers installed on both sides with the active layer inbetween, and facets which radiate part of the light generated in the light emitting area and at the same time, reflect the remainder and amplify it the active layer. The semiconductor laser is provided with a means for having a minimum value of a coherence in a range between 2 mW and 7 mW of output of a light radiated from one of the facets which is a light output power, and for preventing a phenomenon in which the output power is reduced in a range at most 25 mW in accordance with an increase of the current, varied by a variation of a current applied to the active layer.

Figure 2:
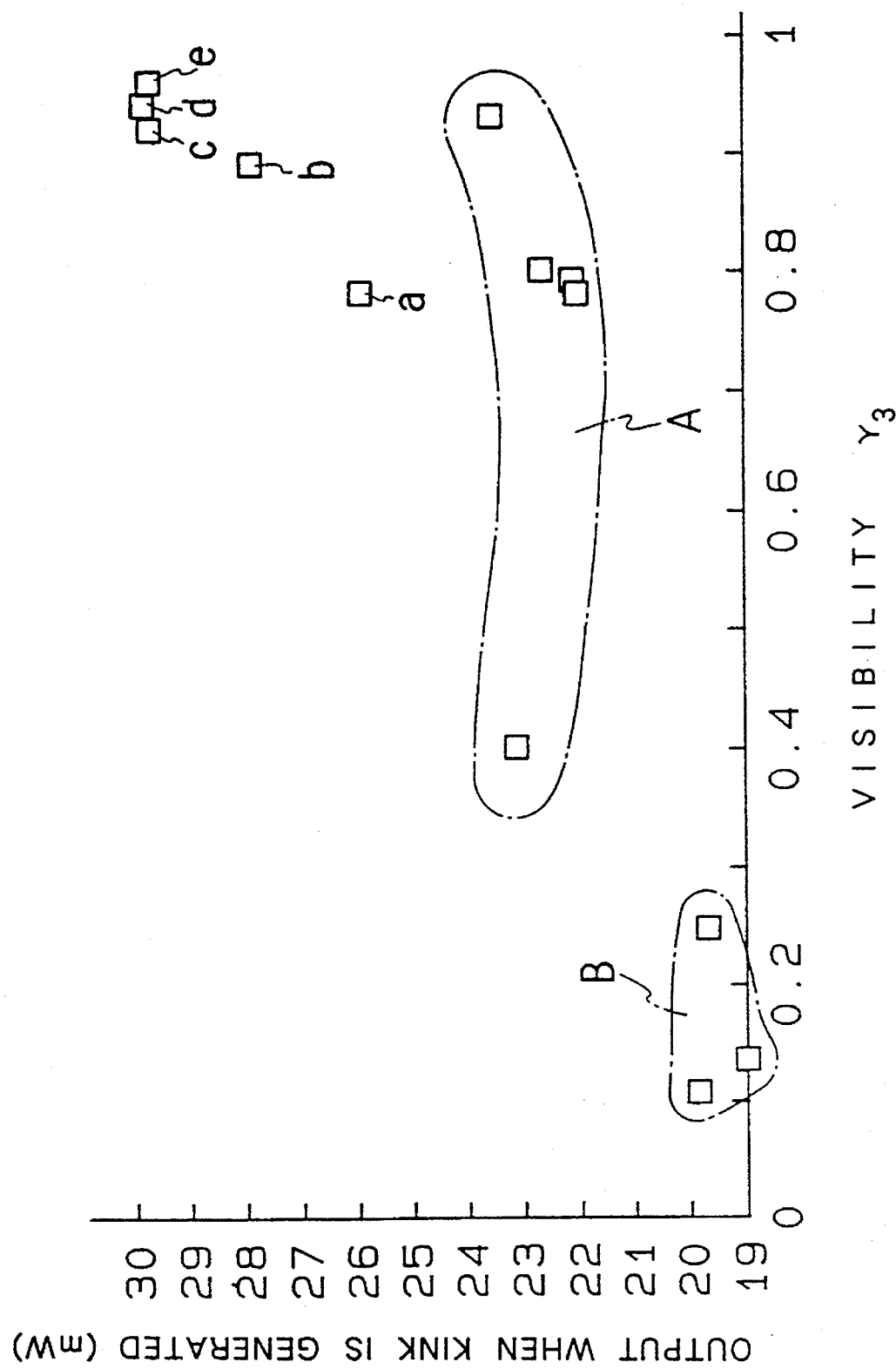
FIG. 2 is a schematic illustration showing the relationship between the visibility (coherence) and a when the output of bare chips, with no dielectric film provided on facets, is 3 mW.
Figure 3:
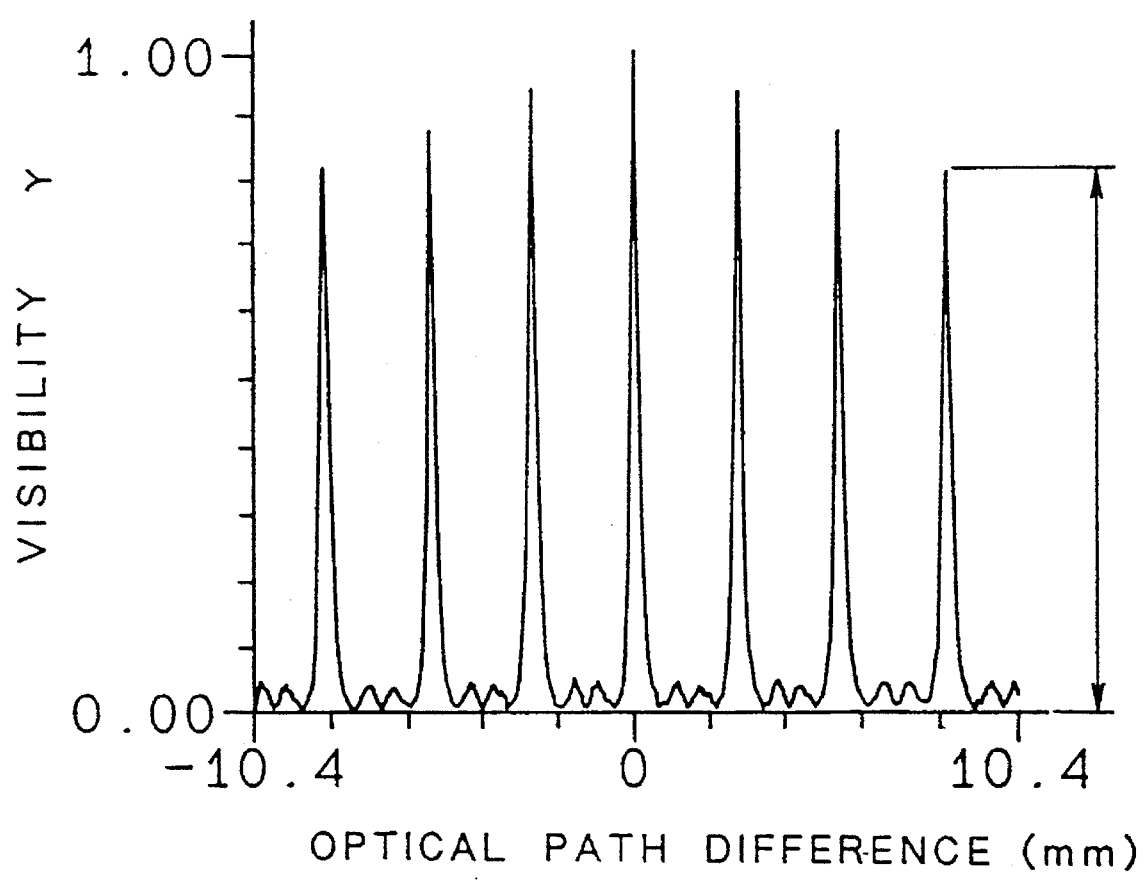
FIG. 3 is an illustration of the visibility showing the coherence of this invention.
Figure 4A:
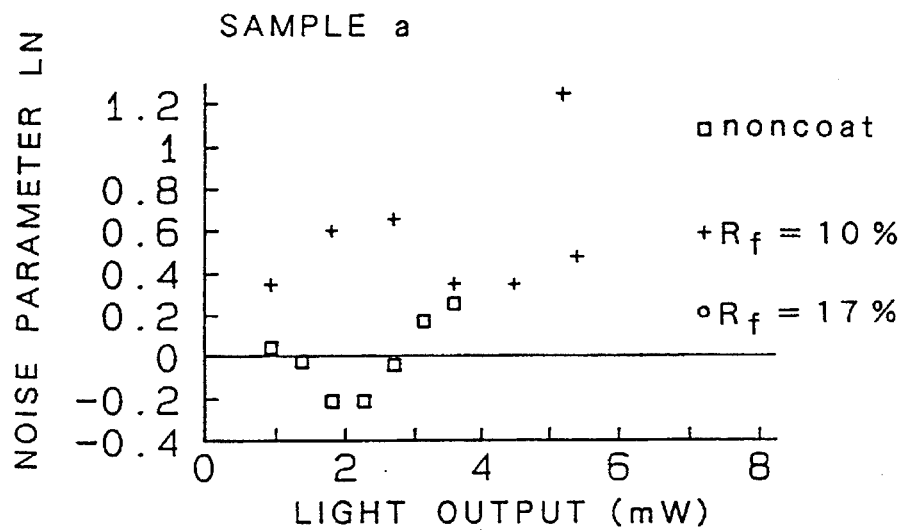
FIGS. 4(a) to 4(e) are each schematic illustration showing the relationship between light output power by reflectance of the beam outgoing side facet and noise parameter.
Figure 4B:
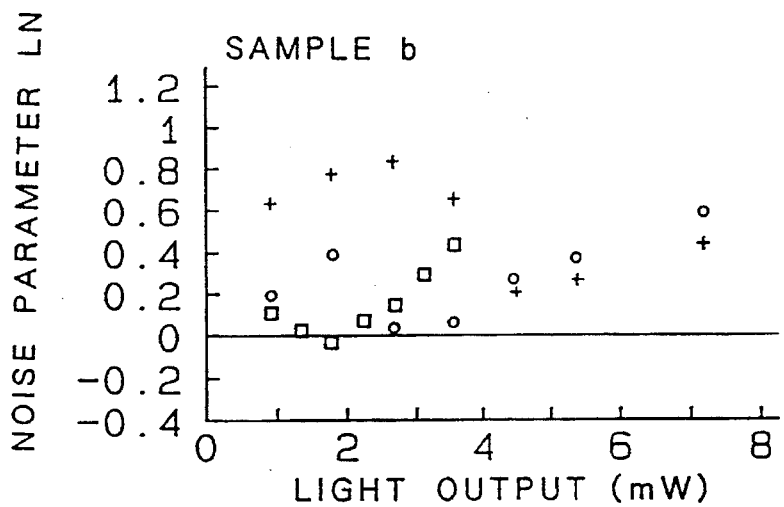
Figure 4C:
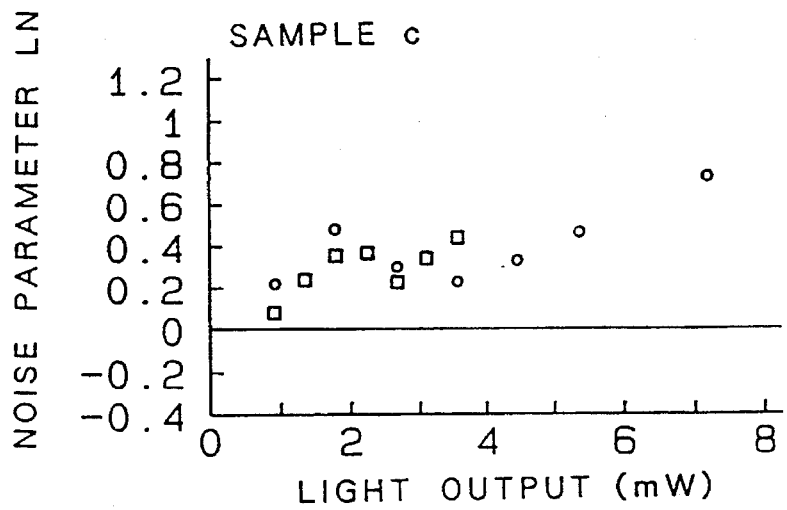
Figure 4D:
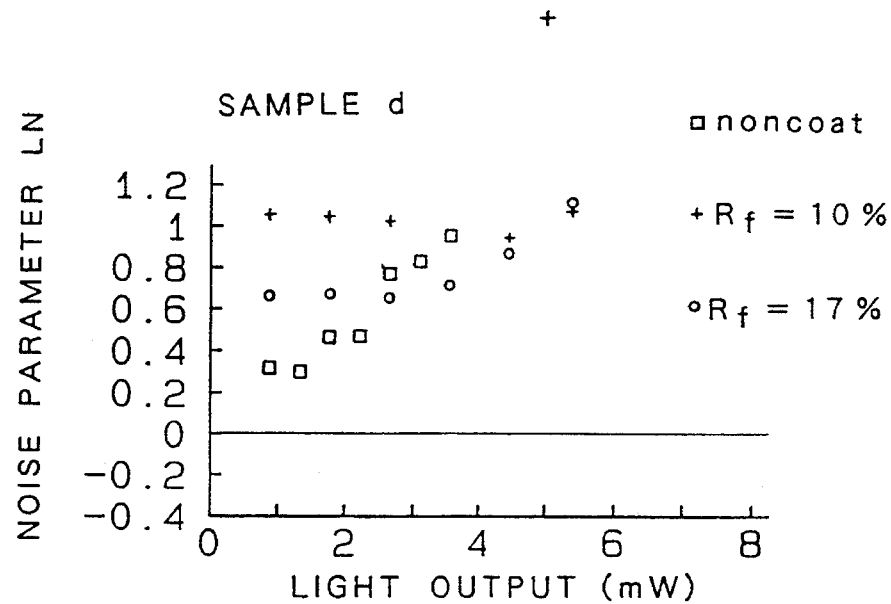
Figure 4E:
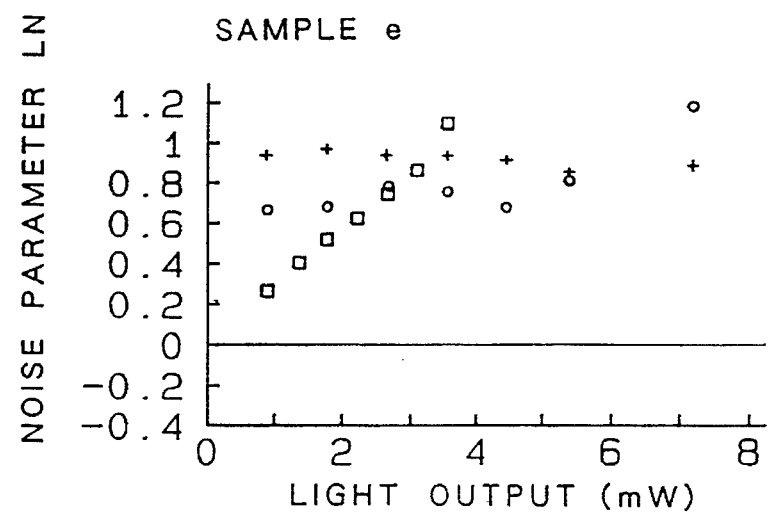
Figure 5A:
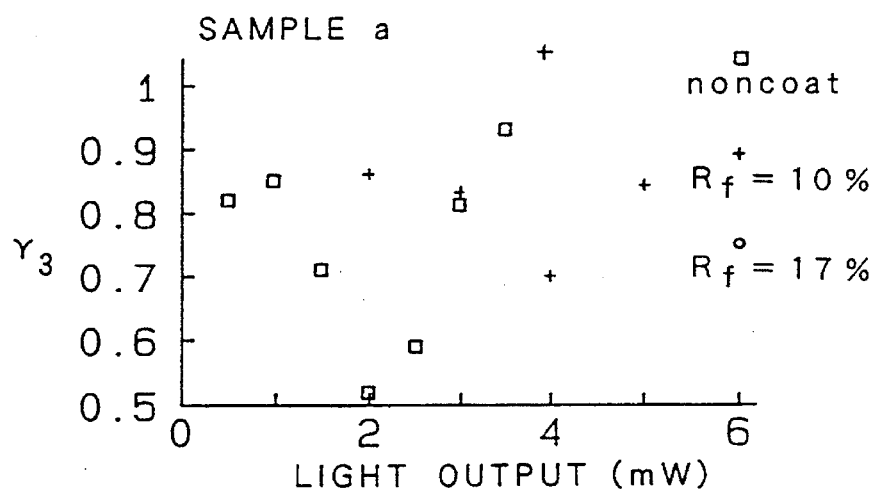
FIGS. 5(a) to 5(e) are each schematic illustrations showing the relationship between the light output power by reflectance on the beam outgoing side facet and the visibility (coherence)
Figure 5B:
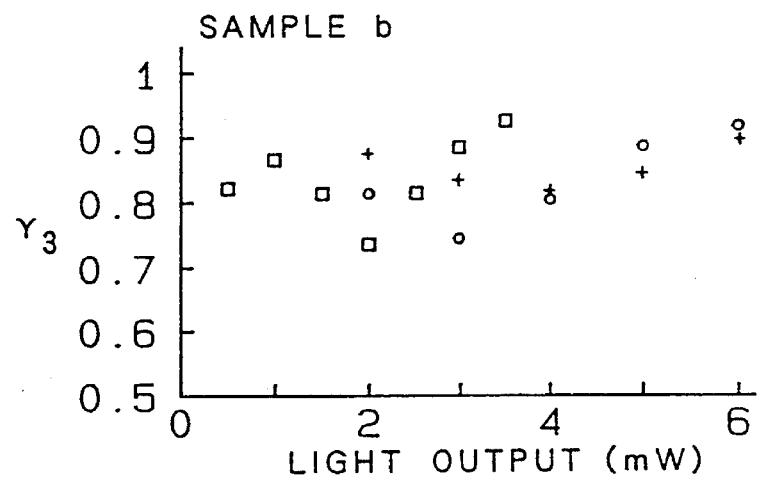
Figure 5C:
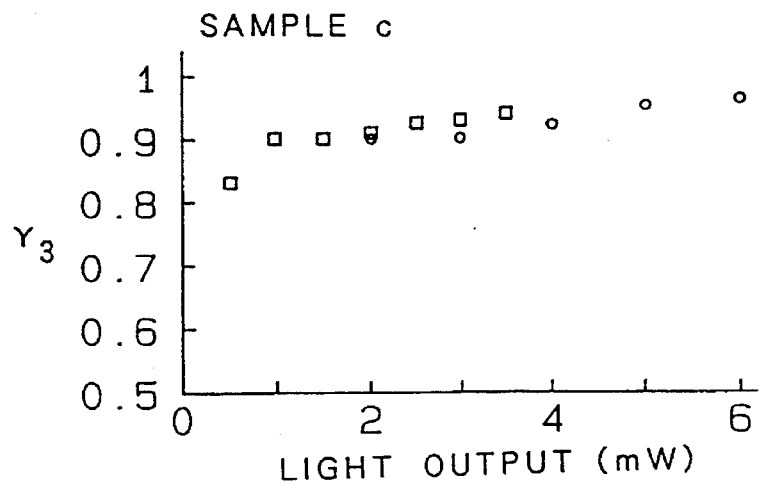
Figure 5D:
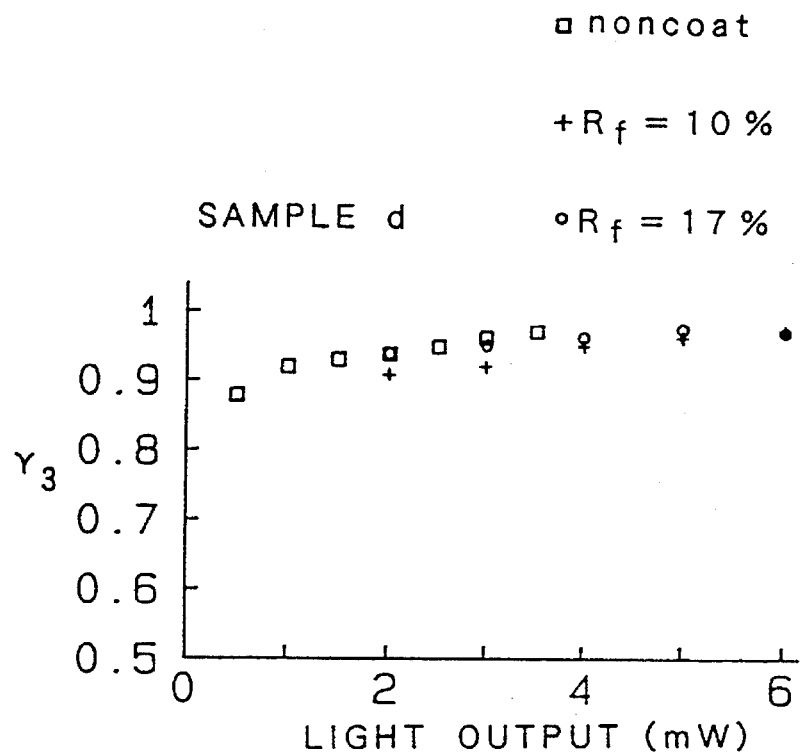
Figure 5E:
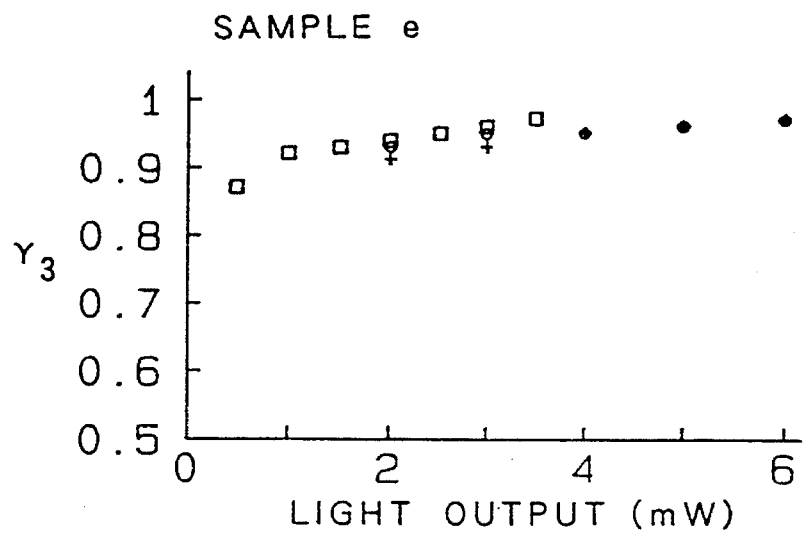

First of all, the relationship between coherence and kink generation was investigated by varying the film thickness of the first upper cladding layer 5. As described above, the adoption of the gain waveguide structure results in lowered kink, a fatal defect for a high output power semiconductor laser, but in the refractive index waveguide structure, reducing the lateral reflectance difference (that is, bringing the structure closer to the gain waveguide structure by increasing the film thickness of the first upper cladding layer 5) allows the semiconductor laser to have gain waveguide type properties in spite of the refractive index waveguide structure. Bringing the structure to the gain waveguide structure increases contribution of spontaneously emitting light and lowers coherence, but it also lowers kink accordingly. FIG. 2 shows the correlationship between visibility, which serves as an index of coherence, and kink when film thickness of the first upper cladding layer 5 is varied in the semiconductor laser bare chip (hereinafter refered to as "chip"), both of the facet are not coated. In this occasion, as an index of visibility, as shown in FIG. 3, the size of coherence peak the third from the coherence spectrum with zero light path difference (hereinafter called "$\gamma_3$") is shown with the value with the interference peak at the time of zero light path difference set as 1, and the correlationship is investigated by the visibility when the light output is 3 mW. FIG. 2 indicates that as $\gamma_3$ lowers, the kink rapidly lowers. In particular, at $\gamma_3 < 0.9$, sudden decrease and dispersion are observed, suggesting a necessity to achieve 0.8 or higher for $\gamma_3$ in order to obtain light output power exceeding 20 mW. However, the semiconductor laser whose $\gamma_3$ is 0.8 or higher provides high coherence, and it has been difficult to successfully suppress optical feedback noise.

The inventors of this invention have further investigated in detail noise and spectral characteristics with respect to chips whose output is 25 mW or higher at which kink occurs in FIG. 2 (samples a to e in order of low output as shown in FIG. 2), and have acquired the following results. Samples a, b have 3800 Å film thickness of the first upper cladding layer 5, sample c 3500 Å, samples d, e 3000 Å, and group A 3800 Å, and group B 4000 Å, and the film thickness of other layers adopt those illustrated as above. Group A is the same as samples a, b but variation in current may be attributed to variation in manufacturing conditions.

FIG. 4 shows light output power dependency of the optical feedback noise when facets are not coated for samples a to e (samples shown with a to e in FIG. 2) and when the facets are coated so that the reflectance of beam outgoing side facets Rf becomes 10% and 17%. The reflectance Rr of the monitor side facet (which is opposite side of that beam outgoing side facet) is set constant to 75%. In this event, as an index of the optical feedback noise, in order to standardize the noise parameter LN expressed by Eq. (1), that is, a peak to peak value of the maximum AC component (noise component) lower than 200 kHz at each light output power, logarithm of a ratio to the DC value of the 3 mW light output is used. The reason why investigation is made at 200 kHz or lower is that the low-frequency noise at this band frequently poses problems in optical disks.

$$LN = \log((\text{AC component})/(3 \text{ mW DC component}) \times 100) \quad (1)$$

a to e in FIG. 4 correspond to samples a to e. From FIG. 4, of samples a to e, samples a, b, c minimize the optical feedback noise at 5 mW to 6 mW when Rf=10% and at 3 mW to 4 mW when Rf=17% after the facets are coated, and when the reflectance Rf of the beam outgoing side facet is increased the light output which provides the minimum noise moves to the lower output side.

That is, under the noncoating condition in which non-dielectric film is provided on the facets, the reflectance is around 30% and the minimum noise occurs at 1 mW to 3 mW but when the reflectance is lowered, the output that minimizes noise moves to the larger output side. In keeping with this, the output power at which kink occurs moves to further larger side, and at the high output band, high output power is obtained without any trouble.

On the other hand, samples d, e do not exhibit this kind of tendency. Compared to the case when Rf=10%, that of 17% tends to provide slightly better noise condition because connections between the feedback light and laser resonator are slightly decreases, but samples d, e apparently provide a higher noise level than the minimum values of samples a to c. As clear from FIGS. 4(a) and 4(e), no minimum noise appears even under the noncoating condition in which non-dielectric film is provided on the facets, indicating that those samples have a structure the same as the conventional refractive index waveguide structure.

FIG. 5 shows light output dependency of coherence of samples same as FIGS. 4(a) to (e).

The difference between samples a, b, c and samples d, e is observed in the light output power dependency of coherence shown in FIG. 5. A particularly significant difference lies in that in samples d, e, $\gamma_3$ monotonously increases but samples a, b, c, $\gamma_3$ achieve the extremum at about 2 mW between 1 mW and 3 mW.

Based on the above-mentioned results, samples a, b, c lower coherence most at the light output around 2 mW, except in the vicinity of a threshold value (that is, the portion where $\gamma_3$ lowers at the light output less than 1 mW) at the stage in which no facet coating is provided. That is, the optical feedback noise is suppressed most. In addition, varying the facet reflectance varies the light output that minimizes coherence. Consequently, it can be said that it is possible to move the portion that achieves the lowest noise to an optional light output power by controlling the facet reflectance.

These results theoretically hold true if they are interpreted as follows:

A visibility which is Fourier-transformed is a laser oscillation spectrum, so that the greater the spectral line width, the lower the coherence. The spectral line width $\Delta v$ is given by the following formula (for example, see "Single Frequency Semiconductor Lasers" by Jens Buus, SPIE Optical Engineering Press, 1990, page 61).

$$\Delta v = R(1+\alpha^2)/(4 \pi S')$$

where, R is a constant representing contribution of spontaneously emitted light, S' the number of photons in the laser resonator, and $\alpha$ a coefficient called a line width enhancement factor. That is, the line width is a function of the number of photons in the resonator.

On the other hand, the relationship between the number of photons in the resonator S' and the light output $P_o$ is expressed by the following equation.

$$P_0 = \frac{\left(\frac{R_r}{R_f}\right)^{1/2} \cdot \frac{1-R_f}{1-R_r}}{\left(\frac{R_r}{R_f}\right)^{1/2} \cdot \frac{1-R_f}{1-R_r} + 1} \cdot S' h v V_g \frac{1}{2L} \ln \frac{1}{R_f R_r}$$

where, L length of the resonator, Rf, Rr are reflectance of beam outgoing side facet output and reflectance of the monitor-side facet, respectively, h is a Plank's constant, ν is frequency, and Vg is group velocity.

Based on this expression, the relationship between the light output at the stage of uncoated facets and the light output power after facets are coated, which provide the same number of photons in the resonator, is expressed in FIG. 6. In FIG. 6, the solid lines show the case when Rf=10% and Rr=75%, and the broken lines show that when Rf=17% and Rr=75%. FIG. 6 plots the data when Rf=10% for above-mentioned sample a, Rf=10% and 17% for sample b, and Rf=17% of sample c, indicating nearly good agreement with computed values.

To summarize the above, a process for obtaining a semiconductor laser which exhibits low noise characteristics at the low output power and is able to achieve single transverse mode oscillation up to high output power can be described as follows:

In the semiconductor laser chip of refractive index waveguide structure, the lateral refractive index difference is reduced to minimum in the range which maintains the kink level that enables high output operation in accordance with applications. As observed in FIG. 2, reducing the lateral refractive index difference (that is, coherence is reduced) results in lowering of kink. Consequently, since the refractive index difference is unable to be reduced excessively, contribution of spontaneous emission is small, while increasing the light output power to about 3 mW substantially increases coherence with an increase in the number of photons in the resonator, but the semiconductor laser behaves in such a manner that coherence is once reduced or becomes the extremum.

In this way, the chip facet is coated and the facet reflectance is adjusted so that a desired high output semiconductor laser is obtained, and the implementation method is described as follows:

For example, in order to achieve low noise in the vicinity of 3 mW to 4 mW light output, Rf=17% and Rr=75% should be set as observed in FIG. 4, while to achieve low noise at 4 mW to 5 mW, Rf=10% and Rr=75% should be selected. In this case, Rf is varied with Rr is set constant to 75% but it is not limited to Rr=75% but as described above, it should be so designed that the number of photons in the resonator becomes equivalent to that at the 2 mW output when the facets are not coated. However, in order to secure reliability at the time of high output, it is desirable to design within the range of Rf≦30% and Rr≧50%.

As a means to allow the light output power to have the extremum of coherence in the range of 2 mW to 7 mW and to prevent generation of kink at least in the range of 25 mW or lower, in said embodiment, the film thickness of the first upper cladding layer is increased and the current blocking layer is kept away, thereby reducing the lateral refractive index difference and bringing the laser structure closer to the gain waveguide structure. However, in order to bring the refractive index waveguide structure closer to the properties of the gain waveguide structure, that is, as factors that determine the lateral refractive index difference, there are film thickness of the active layer, refractive index difference between the cladding layer and the active layer, stripe width, film thickness of the current blocking layer, leak current rate (greatly dependent on crystal growth conditions) in addition to the above means.

For example, as the active layer thickness increases, it becomes possible to reduce the lateral refractive index difference, and as the cladding layer refractive index is designed to be smaller than that of the active layer, the lateral refractive index difference can be reduced. As the leak current rate decreases, it becomes possible to reduce the lateral reflectance difference by the plasma effects. Because the leak current rate greatly depends on the crystal growth conditions, it is inevitable for variation to occur to some extent in the manufacturing process, and it is unable to precisely control, but the material of each semiconductor layer and film thickness can be freely controlled by selection at the time of manufacturing. At the stripe width 3 μm or less, the refractive index difference also becomes small by the same plasma effects. However, combining these individual factors exhibits a set of contributions of each factor, and many combinations are generated as a means to allow the light output power to have minimum coherence in the range from 2 mW to 7 mW and to prevent generation of kink at least in the range of 25 mW or lower.

For example, the above-mentioned example indicates that for semiconductor materials, if the active layer has y=0.15 of $Al_yGa_{1-y}As$ to be 500 Å and x of $Al_xGa_{1-x}As$ to be 0.6, the requirements can be satisfied if the first upper cladding layer thickness is 3500 Å to 3800 Å. In this event, the lateral refractive index difference $\Delta\eta$ is computed as follows when the change of refractive index due to current is ignored, $$\Delta\eta = (\beta_o - \text{Real } \beta')/k_o \quad (2)$$

where $\beta_o$ is a propagation coefficient in the resonator direction in the stripe, $\beta'$ a propagation coefficient in the resonator direction outside the stripe, and $k_o$ a wave number in a vacuum, and is within the range from $4.2\times10^{-3}$ to $5\times10^{-3}$.

In general, the equation of the electric field which expresses the TE mode (light propagated by the semiconductor laser is a TE mode) which propagates the dielectric waveguide path in the resonator direction is expressed by the following equations.

$$\frac{\partial^2 Ey}{\partial x^2} + \{(n(x)k_0)^2 - \beta^2\}Ey = 0 \quad (3)$$

where, Ey is a y direction component of the electric field and n(x) the reflectance, $$k_0 = \frac{2\pi}{\lambda_0} \quad (\lambda_o \text{ is wavelength in a vacuum})$$

and β is a propagation coefficient in the z direction given with an eigenvalue that satisfies this expression. Let the propagation coefficient β given by Eq. (3) be $\beta_o$ when the dielectric substance is supposed to be uniformly infinite in both z and y axes directions at the point where it is cut out vertical to the y axis (see FIG. 1) at a certain point $y_1$ in the stripe and let the propagation coefficient β given with the dielectric substance supposed to be uniformly infinite in both z and y axes directions at the point where it is cut vertical to the y axis at a certain point $y_2$ outside the stripe be β' (in this event, β' is a complex number because of the effects of absorption by the current blocking layer); then, the effective reflectance difference $\Delta\eta$ inside and outside the stripe becomes Eq. (2).

$\beta_o$–Real β' becomes greater as the active layer thickness is thinner, while it becomes smaller as the Al composition difference between the active layer and cladding layer is greater, and it becomes greater as the distance between the active layer and the current blocking layer is closer.

Consequently, the above-mentioned means can be achieved by manufacturing the semiconductor laser in such a manner that the difference between refractive indexes determined from the semiconductor materials of the active and first upper cladding layers and that given by computation from the thickness is within the range from $4.2\times10^{-3}$ to $5\times10^{-3}$.

As part of the relationship between the composition and thickness of the semiconductor layer from which the reflectance difference is given by such computation is shown in FIG. 1, the thickness required for the first upper cladding layer is set in accordance with the composition (x value) of the first upper cladding layer and the thickness of the active layer. Table 1 illustrates only very part of the combination, and a wide variety of combinations are possible, for example, in the range of $0.45 \leq x \leq 0.75$ for the Al composition of the first upper cladding layer $Al_xGa_{1-x}As$, $0 \leq y \leq 0.22$ for the Al composition of the active layer $Al_yGa_{1-y}Ax$, and $0.05 \leq z \leq 0.22$ for the Al composition of the evaporation prevention layer $Al_zGa_{1-z}As$.

TABLE 1

| Composition of Al of first upper cladding layer (x) | Thickness of active layer (Å) | Thickness of first upper cladding layer (Å) |
| --- | --- | --- |
| 0.6 | 600 | 3250 to 3500 |
| 0.6 | 700 | 2975 to 3200 |
| 0.6 | 800 | 2700 to 2950 |
| 0.5 | 500 | 3425 to 3700 |
| 0.5 | 600 | 3125 to 3375 |
| 0.5 | 700 | 2875 to 3075 |
| 0.5 | 800 | 2625 to 2825 |

FIGS. 7(a) and 7(b) show the relationship between the film thickness of the first upper cladding layer and the refractive index difference when the thickness of the active layer with respect to the composition of this first upper cladding layer is used as a parameter. FIG. 7(a) shows the case when the Al composition of the first upper cladding layer is x=0.6, while FIG. 7(b) shows the case when the Al composition of the first upper cladding layer is x=0.5.

This relationship can give the above-mentioned theoretical refractive index difference by adjusting the refractive index and film thickness of each layer even when AlGaInP-based and InGaAsP-based semiconductors are used in addition to the AlGaAs-based semiconductor, and a semiconductor laser which provides small noise at a low output in the range of 2 mW to 7 mW and does not generate kink, at least, up to the output 25 mW or lower.

In addition, in the above example, reference is made to the SAM structure which is a self-aligning structure using the MBE technique later discussed for the crystal growth technique, but in addition to the SAM structure, semiconductor lasers based on the complex refractive index waveguide structure such as CSP structure or VSIS structure by the LPE technique or SAS structure by the MOCVD technique as well as those of real refractive index waveguide structure disclosed in Japanese Unexamined Patent Publication No. 160503/1993 can achieve low noise at low output and provide high output free from kink in the same manner.

For the dielectric film installed the outgoing beam facet, single-layer film of $Al_2O_3$ or $Si_3Cl_4$ can be used, and varying the film thickness, the reflectance can be varied. However, as long as these single-layer films are used, the reflectance Rf is constantly smaller than 50%. On the other hand, for the monitor side facet, in addition to the multi-layered film in which said Al$_2$O$_3$/amorphous Si (hereinafter called α-Si) is installed in the thickness of λ/4, respectively, the multi-layered film in which Si$_3$N$_4$/α-Si, Si$_3$N$_4$/SiO$_2$, Al$_2$O$_3$/SiO$_2$ are installed in the thickness of λ/4, respectively, may be used.

The reflectance of these facets can be adjusted optionally by varying the thickness of the dielectric film and the reflectance of beam outgoing side facet is adjusted so that coherence is minimized at the relevant output in accordance with the reading output of the models to be incorporated as described before, but the reflectance is adjusted to be 30% or lower for the beam outgoing side facet and 50% or higher for the monitor side facet, and more preferably 70% to 90%. When the reflectance of the monitor side facet is small, the emitting light from the beam outgoing side facet is decreased, while if the reflectance is excessively large, the monitor side output power becomes excessively small.

EXAMPLE 1

Referring now to a specific embodiment, the semiconductor laser of this invention will be described further in detail.

For the method to manufacture a semiconductor laser of the structure shown in FIG. 1, the SAM (Self aligned structure by MBE) structure (see "Self-aligned Structure Type Laser by MBE" by Haruo Tanaka et al, Japanese Journal of Applied Physics, Vol. 24, Page 89, 1985) was used. That is, by the first MBE (molecular beam epitaxy), the lower cladding layer 3 comprising the n type Al$_x$Ga$_{1-x}$As (x=0.6) in 20000 Å, the active layer 4 comprising the n type Al$_y$Ga$_{1-y}$As (y=0.15) in 500 Å, the first upper cladding layer 5 comprising the p type Al$_x$Ga$_{1-x}$As (x=0.6) in 3700 Å, a current blocking layer 6 comprising the n type GaAs in 2800 Å, and the evaporation prevention layer 7 comprising the n type Al$_z$Ga$_{1-z}$As (z=0.15) in 700 Å were formed successively by allowing crystals to grow, and lastly, for a protection film, nondope GaAs was allowed to grow in 400 Å.

This was removed from the MBE chamber and a 3.9 μm width stripe groove was drilled from the first crystal grown layer surface to the depth in which the blocking layer 6 remained in about 1000 Å. The reason why the layer was left in about 1000 Å was to prevent the first upper cladding layer 5 from coming in contact with air.

The substrate with the stripe groove drilled in this way is placed in the MBE equipment and, first, the substrate is heated with the arsenic molecular beams irradiated. In this event, GaAs remaining on the bottom of the stripe groove and GaAs protection film which was allowed to grow lastly in the first growth evaporate and the first upper cladding layer 5 comprising the clean p type Al$_x$Ga$_{1-x}$As (x=0.5) and the evaporation prevention layer 7 comprising the n type Al$_z$Ga$_{1-z}$As (z=0.15) are exposed. Thereafter, for the second MBE growth, the second upper cladding layer 8 comprising the p type Al$_x$Ga$_{1-x}$As (x=0.6) in 16000 Å and the p type GaAs cap layer 9 in 20000 Å were formed by allowing crystals to grow, and then, the upper and lower electrodes 1, 10 were formed, the substrate was cut and separated into chips. In this event, the resonance length was designed to be 350 μm.

Figure 8A:
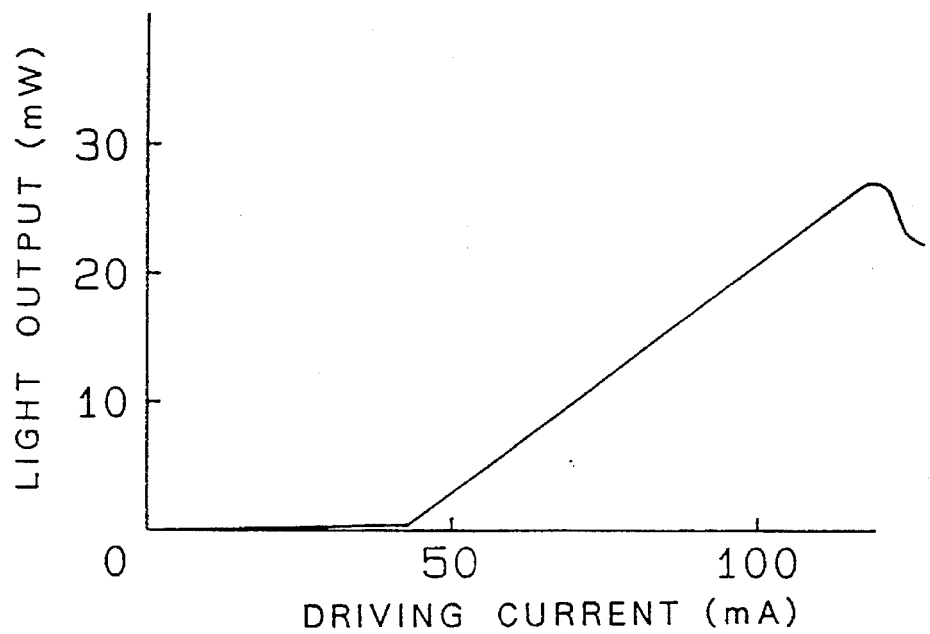
FIGS. 8(a) and 8(b) show the characteristics when coating is not carried out on the facets of the semiconductor laser according to Example 1.
Figure 8B:
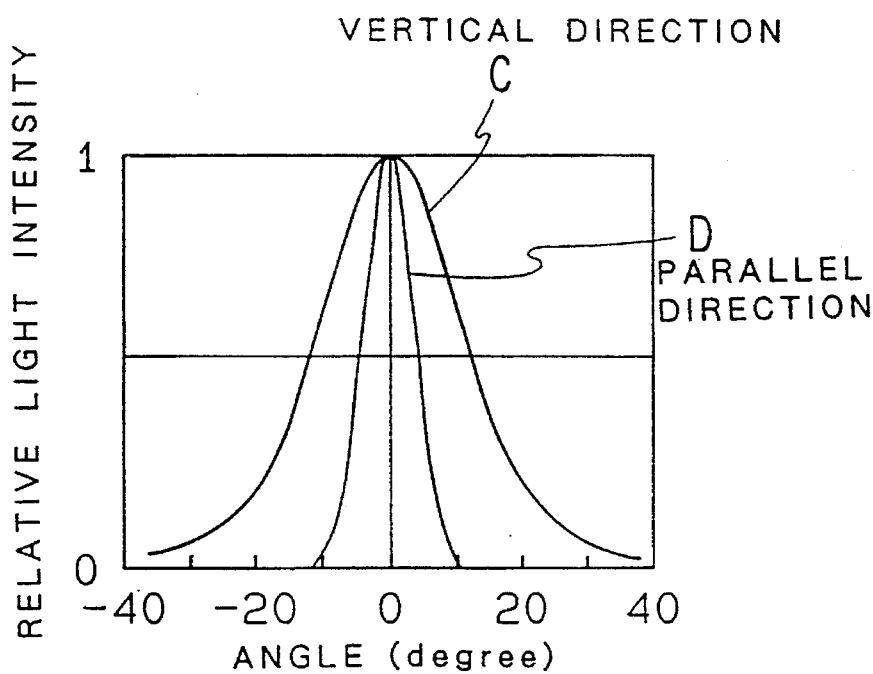
Figure 9:
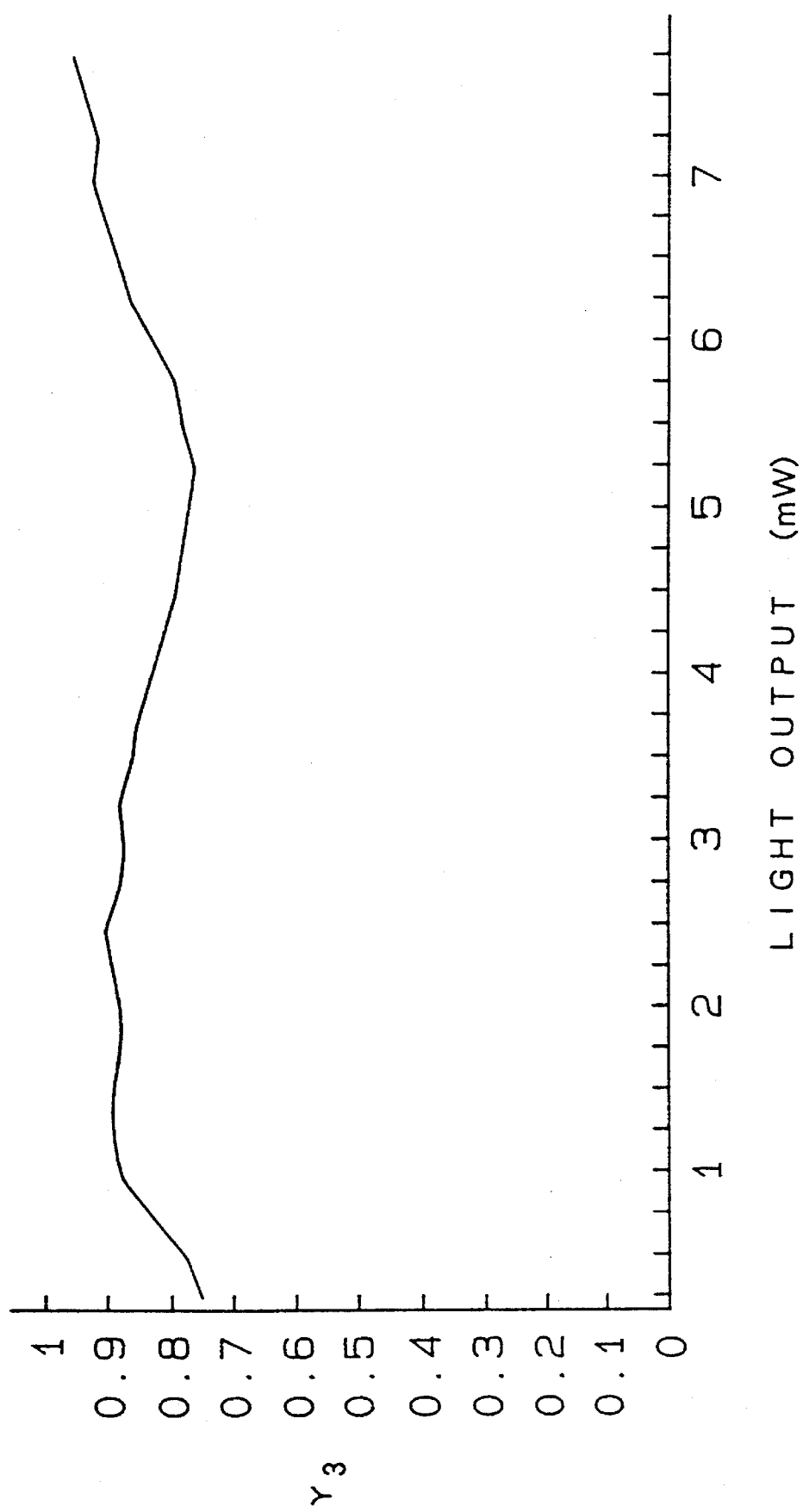
FIG. 9 shows the relationship between the light output power and visibility when coating is not carried out on facets of the semiconductor laser according to Example 1.

FIG. 8(a) shows the current relative to light output characteristics of the chips obtained in this way, while FIG. 8(b) shows the relative light intensity, respectively, by light radiation angle. In FIG. 8(b), C is a radiation angle vertical to the active layer and D a relative light intensity with respect to the parallel radiation angle. FIGS. 9(a) and 9(b) show the light output dependency of γ$_3$.

Figure 10:
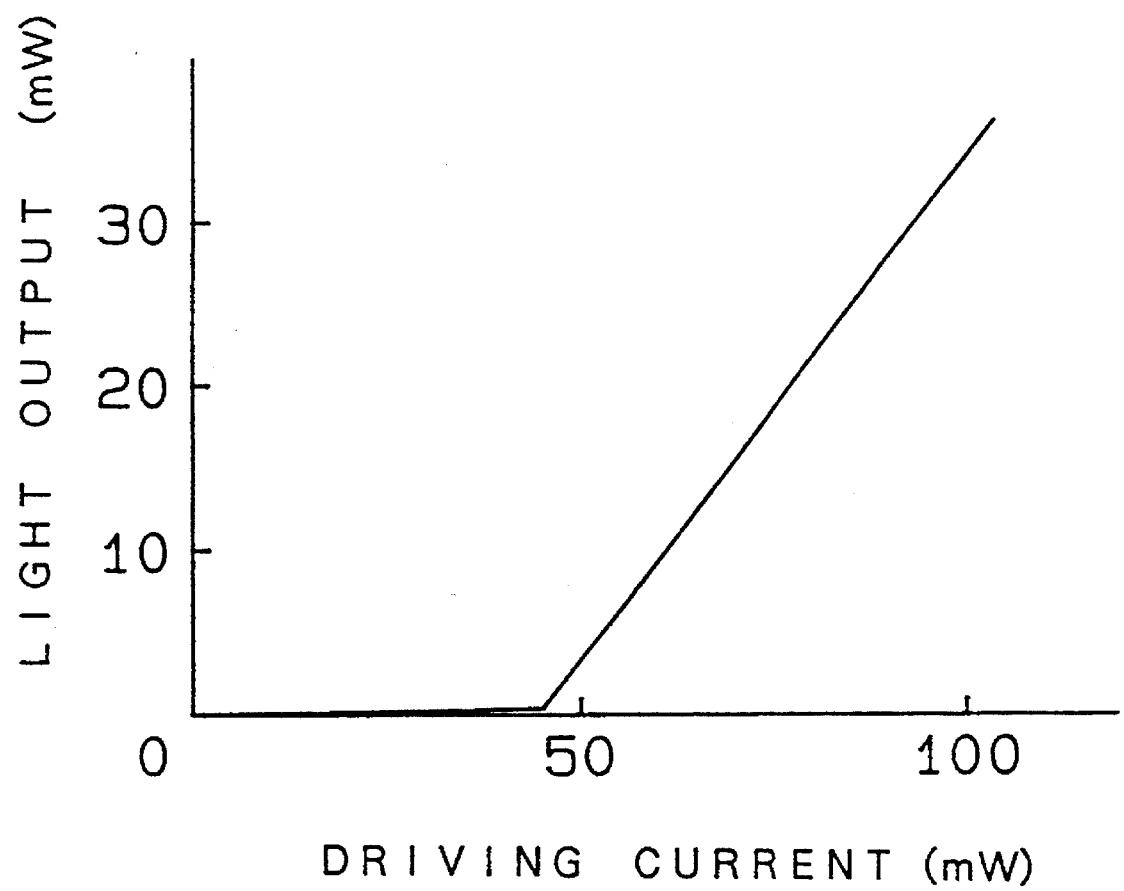
FIG. 10 shows the relationship between the driving current and the light output when facet coating is carried out on the beam outgoing side facet of the semiconductor laser according to Example 1 and reflectance is designed to be 11%.
Figure 11:
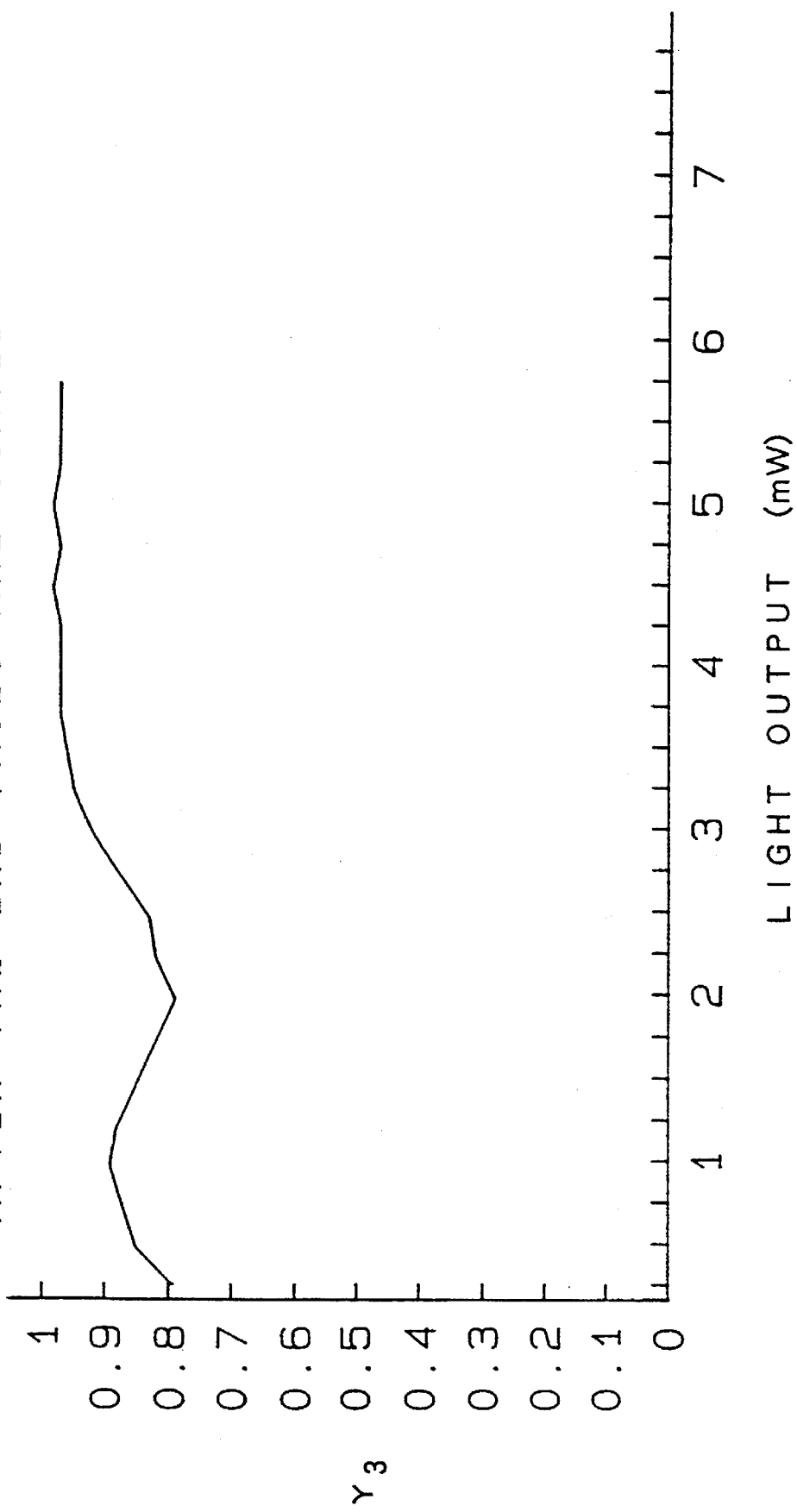
FIG. 11 shows the relationship between the light output power and the visibility (coherence) when facet coating is carried out on the beam outgoing side facet of the semiconductor laser according to Example 1 and reflectance is designed to be 11%.
Figure 12:
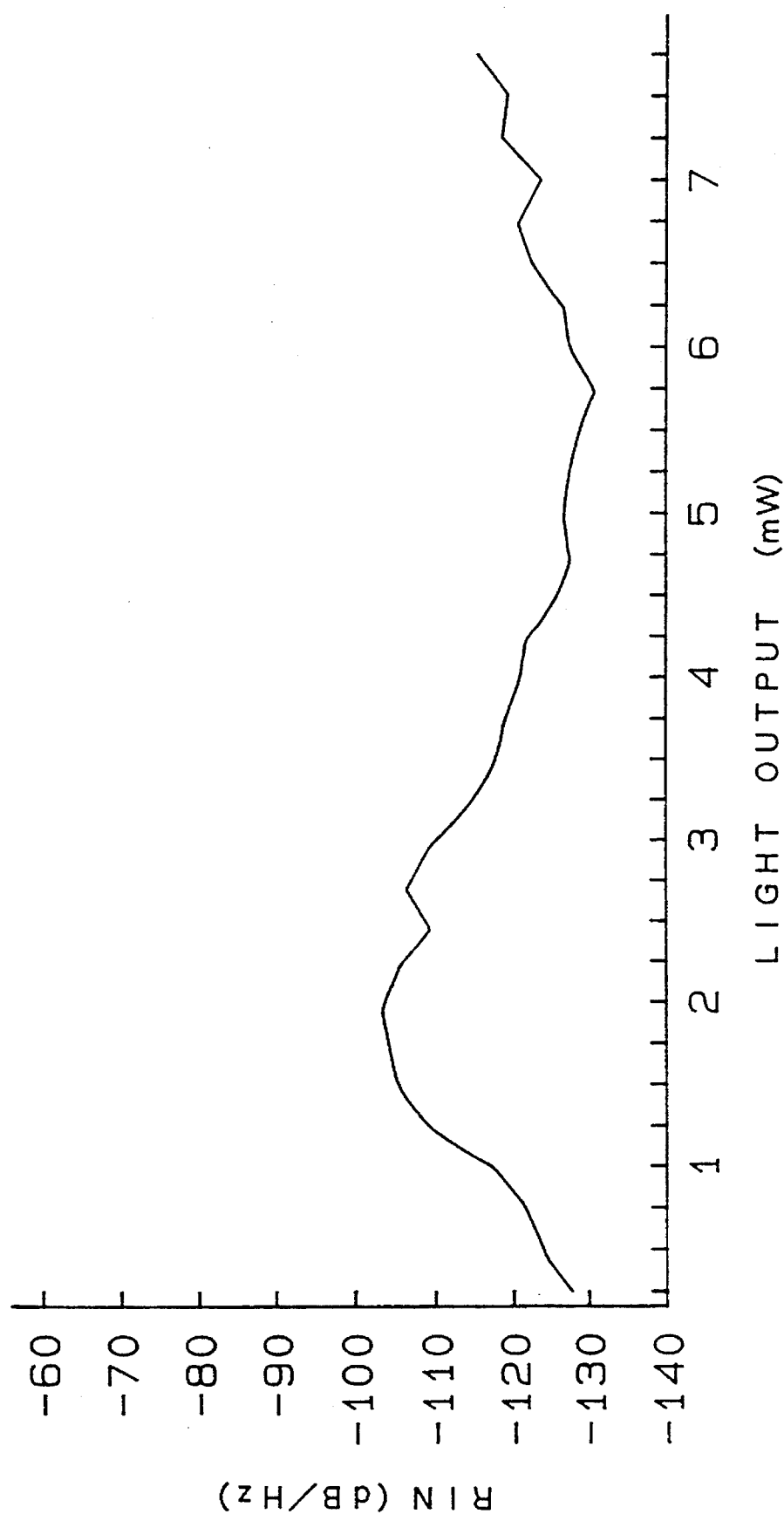
FIG. 12 shows the relationship between the light output power and the relative intensity noise when facet coating is carried out on the beam outgoing side facet of the semiconductor laser according to Example 1 and reflectance is designed to be 11%.

To this chip, for an facet coating, Al$_2$O$_3$ was laminated 0.32 λ/η$_1$ (η$_1$ is reflectance of Al$_2$O$_3$) thick on the beam outgoing side facet and Al$_2$O$_3$ was laminated λ/η$_1$ thick and α-Si on the monitor side facet λ/4 η$_2$ (η$_2$ is reflectance of α-Si) thick successively by spattering. The reflectance Rf=11% was obtained for the beam outgoing side facet and Rr=77% for the monitor side facet. FIGS. 10(a) and 10(b) show the characteristics of the current and light output power in this event and FIG. 11 the light output dependency of γ$_3$. That is, before coating the facet, the kink which was present in the vicinity of 25 mW was not observed up to 35 mW and the minimum position of γ$_3$ which existed in the vicinity of 2 mW before coating the facet moved to the vicinity of 5 mW after coating the facet. These results indicate that coating of the facet allows the minimum value of the noise to occur in the vicinity of 5 mW and prevents kink from generating even at high output exceeding 30 mW. FIG. 12 shows the light output power dependency of RIN (relative intensity noise) at 5% feedback ratio. At 5 mW, it was located at 125 dB/Hz or lower, which attained the sufficiently practical level. The astigmatism was about 7 μm (measured by the knife edge method), which was also at the sufficiently practical level.

According to the present invention, a semiconductor laser which can suppress the optical feedback noise in the operation under low output of 2 mW to 7 mW and prevents kinks at least in the range below 25 mW and provides high output even with the index guide structure which enables the single transverse mode up to the high output power operation can be obtained.

Further, according to the present invention, the semiconductor can satisfy other properties (low ellipticity, low astigmatism) conventionally required for semiconductor lasers used for pick-up light source for mini disks and photo-electro-magnetic disks.

Furthermore, according to the present invention the semiconductor can minimize the optical feedback noise at the required reading output in accordance with the models with varying reading outputs with the chip structure remaining as class I.

Though several embodiments of the present invention are described above, it is to be understood that the present invention is not limited only to the above-mentioned, various changes and modifications may be made in the invention without departing from the spirit and scope thereof.

What is claimed is:

1. A semiconductor laser comprising:

an active layer having a light-emitting region of striped structure;

an upper cladding layer formed on said active layer;

a lower cladding layer formed under said active layer, said active layer being interposed between said upper and lower cladding layers;

facets formed on both ends of a stripe of said light-emitting region in which a part of light emitted is radiated, remaining light is reflected and amplified; and a means for having a minimum value of a coherence in a range between 2 mW and 7 mW of output of a light radiated from one of said facets which is a light output power, and for preventing a phenomenon in which said output power is reduced in a range at most 25 mW in accordance with an increase of said current, varied by a variation of a current applied to said active layer, wherein said means includes a current blocking layer having a striped groove, said upper cladding layer includes first and second upper cladding layers, said current blocking layer formed between said first and second upper cladding layers, said first upper cladding layer being provided on one side of said active layer, a difference of a refractive index in a lateral direction of said active layer, said first upper cladding layer, and said current blocking layer being ranged between $4.2 \times 10^{-3}$ and $5 \times 10^{-3}$, said difference of refractive index being calculated from each refractive index and each thickness of said active layer, said first upper cladding layer and said current blocking layer.

2. The semiconductor laser of claim 1, wherein said first upper cladding layer is made of $Al_xGa_{1-x}As$ ($0.45 \leq x \leq 0.75$), said active layer is made of $Al_yGa_{1-y}As$ ($0 \leq y \leq 0.22$).

3. The semiconductor laser of claim 2, wherein said first upper cladding layer is made of $Al_xGa_{1-x}As$, thickness of said first upper cladding layer being ranged between 2700 Å to 4000 Å, where x is 0.6.

4. The semiconductor laser of claim 2, wherein said first upper cladding layer is made of $Al_xGa_{1-x}As$, thickness of said first upper cladding layer being ranged between 2625 Å to 3700 Å, where x is 0.5.

5. The semiconductor laser of claim 1, wherein a dielectric film with single layer is provided on a side of said facet capable of obtaining a light output power, said facet being one of said facets from which light is emitted, a reflectance is at most 30%.

6. The semiconductor laser of claim 5, wherein said dielectric film is made of $Al_2O_3$ or $Si_3N_4$.

7. The semiconductor laser of claim 1, wherein a multi-layered dielectric film is provided on another facet located on a monitor side, and a reflectance is at least 50%.

8. The semiconductor laser of claim 7, wherein each of the layers of said multi-layered dielectric film has a thickness of one fourth of a wavelength of an emitted light.

9. The semiconductor laser of claim 7, wherein said reflectance is ranged between 70% and 90%.

10. A semiconductor laser according to claim 1, further comprising an evaporation preventing layer formed between said current blocking layer and said second upper cladding layer.

11. A semiconductor laser according to claim 10, wherein said evaporation preventing layer is made of $Al_zGa_{1-z}As$ ($0.05 \leq z \leq 0.22$).

* * * * *